United States Patent
Aritome

(10) Patent No.: US 7,898,856 B2
(45) Date of Patent: Mar. 1, 2011

(54) MEMORY CELL HEIGHTS

(75) Inventor: Seiichi Aritome, Zhudong (TW)

(73) Assignee: Micron Technology, Inc., Boise, ID (US)

(*) Notice: Subject to any disclaimer, the term of this patent is extended or adjusted under 35 U.S.C. 154(b) by 617 days.

(21) Appl. No.: 11/924,103

(22) Filed: Oct. 25, 2007

(65) Prior Publication Data

US 2009/0109752 A1     Apr. 30, 2009

(51) Int. Cl.
*G11C 11/34* (2006.01)
(52) U.S. Cl. .................. 365/185.05; 365/185.1; 365/185.26; 257/443; 257/315; 257/316; 257/314; 408/257; 408/253; 408/396
(58) Field of Classification Search ............ 365/185.01, 365/185.05, 185.27, 185.31; 438/39, 42, 438/257, 253, 396; 257/443, 315, 316, 314, 257/306
See application file for complete search history.

(56) References Cited

U.S. PATENT DOCUMENTS

| 6,191,448 | B1 | 2/2001 | Forbes et al. | |
| 6,380,765 | B1 | 4/2002 | Forbes et al. | |
| 7,388,251 | B2* | 6/2008 | Forbes et al. | 257/315 |
| 2004/0004863 | A1* | 1/2004 | Wang | 365/199 |
| 2006/0028867 | A1* | 2/2006 | Forbes et al. | 365/185.05 |

* cited by examiner

*Primary Examiner*—Pho M Luu
*Assistant Examiner*—Tha-o Bui
(74) *Attorney, Agent, or Firm*—Brooks, Cameron, Huebsch, PLLC

(57) ABSTRACT

Embodiments of the present disclosure provide methods, arrays, devices, modules, and systems for memory cell heights. One array of memory cells includes a number of semiconductor pillars having a number of charge storage nodes, each of the charge storage nodes being associated with a respective number of pillars and separated from the respective pillars by a dielectric. The array also includes a number of conductively coupled gates, each of the number of gates being associated with a respective one of the number of storage nodes. At least two pillars in the array have different heights.

25 Claims, 12 Drawing Sheets

MEMORY CELL HEIGHTS

TECHNICAL FIELD

The present disclosure relates generally to semiconductor devices and, more particularly, to an array of memory cells having different heights.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices typically use a one-transistor memory cell that allows for high memory densities, high reliability, and low power consumption. Flash memory devices are utilized as non-volatile memory for a wide range of electronic applications, including personal computers, personal digital assistants (PDAs), digital cameras, and cellular telephones, among others. Program code and system data, such as a basic input/output system (BIOS) which can be used in personal computing systems, are typically stored in flash memory devices.

Flash memories, comprised of a number of strings formed of one or more memory cells, are typically arranged into array architectures, e.g., a matrix. Two common types of flash memory array architectures are the "NAND" and the "NOR" architectures.

In the NOR array architecture, the floating gate memory cells of the memory array are typically arranged in a matrix. The NOR architecture floating gate memory array is accessed using a row decoder to activate a row of floating gate memory cells by selecting a word select line coupled to their gates. The data values of the row of selected memory cells are then placed on the column sense lines, a data value being indicated by the flow of current corresponding to a particular cell being in a programmed state or an erased state.

A NAND architecture also has its array of floating gate memory cells arranged in a matrix such that the control gates of each floating gate memory cell transistor of the array are typically coupled in rows by word select lines. However, each memory cell is not directly coupled to a column sense line. Instead, the memory cells are electrically coupled together in series, source to drain, between a source line and a column sense line, i.e., bit line, with the drain terminal for each transistor in a string being oriented towards the column sense line.

The NAND architecture memory array is also accessed using a row decoder activating a row of memory cells by selecting a word select line, e.g., row select line, coupled to their gates. A high bias voltage is applied to a selected gate's drain line SG(D). The word select lines coupled to the gates of unselected memory cells of each string are driven to operate the unselected memory cells of each group as pass transistors so that they pass current, e.g., at Vpass, in a manner that is unrestricted by their stored data values. In this manner, a selected transistor is tested for its ability to conduct current, which flows through each group of series-coupled transistors, restricted only by the selected memory cells of each string, thereby placing the current encoded data values of the row of selected memory cells on the column sense lines.

Memory cells in a NAND array architecture can be configured, e.g., programmed, to a desired state. That is, electric charge can be placed on, or removed from, the floating gate of a memory cell to put the cell into any of a number of stored states. For example, a single level cell (SLC) can represent two states, e.g., a 1 or 0. Flash memory multi state memory cells, multibit cells, or multilevel cells, which are referred to hereinafter using the term multilevel cells (MLCs), can be programmed into more than two possible states. MLCs allow the manufacture of higher density memories without increasing the number of memory cells since each cell can represent more than one bit. MLCs can have more than one programmed state, e.g., a cell capable of representing four bits can have fifteen programmed states and an erased state, e.g., 1111, 0111, 0011, 1011, 1001, 0001, 0101, 1101, 1100, 0100, 1110, 1000, 1010, 0010, 0110, and 0000.

MLC memory stores multiple bits on each cell by using different threshold voltage (Vt) levels for each state that is stored. The difference between adjacent Vt distributions may be very small for a MLC memory device as compared to a SLC memory device. The reduced margins between adjacent Vt distributions, e.g., program states, can increase the difficulty associated with distinguishing between adjacent program states, which can lead to problems such as reduced data read and/or data retrieval reliability.

Memory device fabricators are continuously seeking to increase performance. However, the scaling of memory cells is limited by the need to increase and/or maintain coupling between a control gate and a floating gate while minimizing the interference between adjacent floating gates. One method of increasing performance of a floating gate memory cell involves placing more memory cells in the same or a smaller area on a memory device. Unfortunately, this can lead to increased parasitic coupling of the gate stacks.

As NAND array architectures are scaled to smaller physical dimensions, the effects of charge located proximate any particular memory cell structure increases. Thus, charge stored on a floating gate of one memory cell can have an increasingly greater influence on the operation of adjacent memory cells as the distance between the semiconductor substrate pillars of adjacent memory cells decreases. Capacitive coupling increases between the structures forming the memory cells as transistors are formed closer together in more dense arrays. Quantitatively, capacitance is the ratio of charge and voltage (C=Q/V), with voltage being proportional to the product of electric field strength and distance. Therefore, as distance decreases in the denominator of the ratio, capacitance increases for a particular amount of charge.

DETAILED DESCRIPTION

Figure 1:
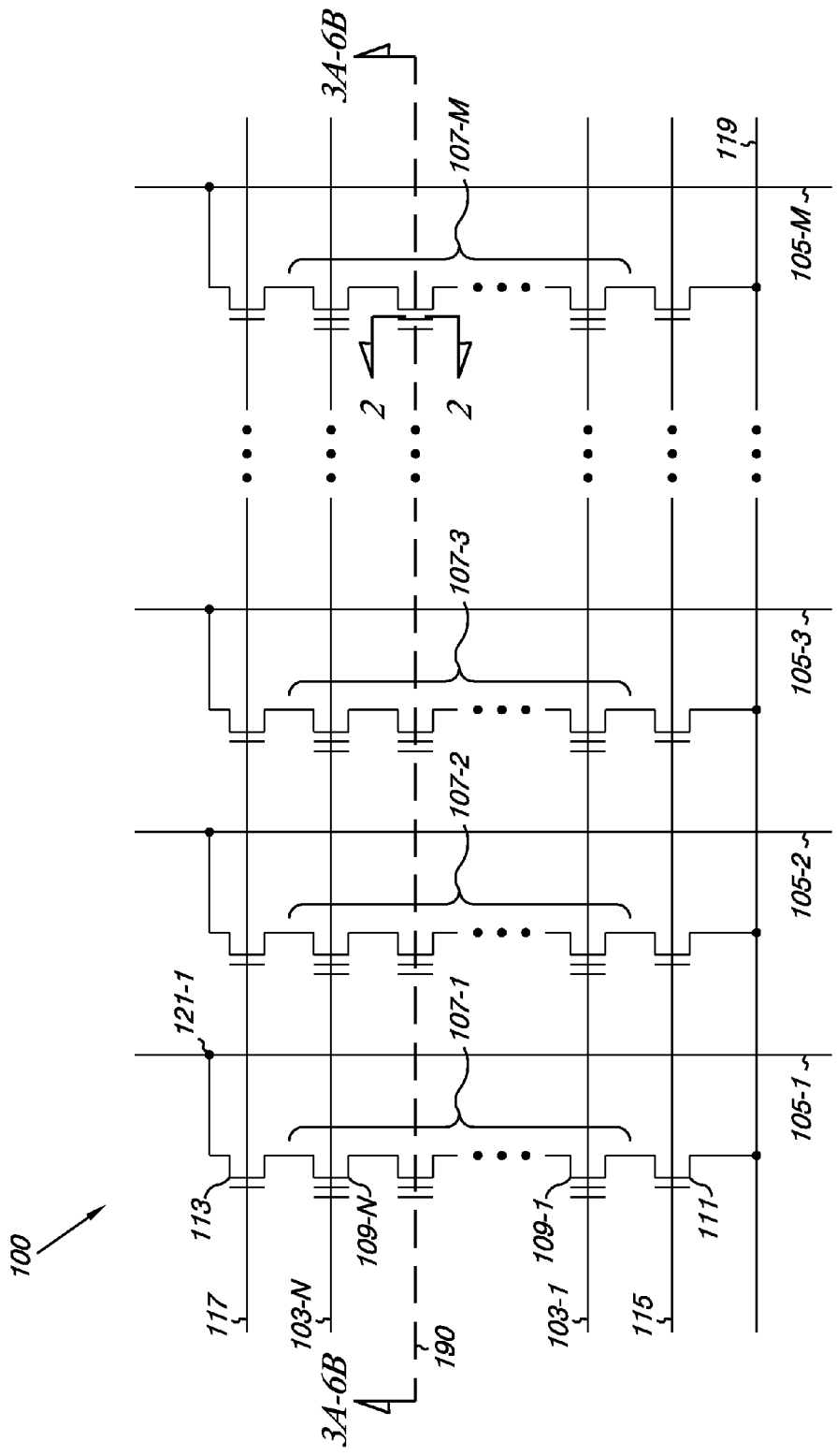
FIG. 1 is a schematic of a portion of a non-volatile memory array that can be used with one or more embodiments of the present disclosure.

Embodiments of the present disclosure provide methods, arrays, devices, modules, and systems for memory cell heights. One array of memory cells includes a number of charge storage nodes, each of the charge storage nodes being associated with a respective one of the number of pillars and separated from the respective pillars by a dielectric. The array also includes a number of conductively coupled gates, each of the number of gates being associated with a respective one of the number of storage nodes. At least two of the pillars in the array have different heights.

In one or more embodiments the memory cells are non-volatile floating gate memory cells arranged in rows, with the gates conductively coupled by a select line and columns coupled to sense lines. The cells along a given select line are formed on pillars fabricated to at least two different heights. In one or more embodiments a first group of pillars associated with the select line are fabricated to a first height and a second group of pillars associated with the select line are fabricated to a second height, the second height being greater than the first height by a distance at least as great as a thickness of the first dielectric.

In one or more embodiments, the cells along a given select line alternate between cells having a pillar fabricated to a first height and cells having a pillar fabricated to a second height. In other embodiments, adjacent pairs along the given select line are formed on pillars fabricated to either the first height or the second height.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. As used herein, the term "substrate" or "substrate assembly" used in the following description may include a number of semiconductor-based structures that have an exposed semiconductor surface. The semiconductor need not be silicon-based. For example, the semiconductor can be silicon-germanium, germanium, or gallium-arsenide. When reference is made to "substrate" in the following description, previous process steps may have been utilized to form regions or junctions in or on the semiconductor structure and/or foundation.

As used herein, "layer" can refer to a layer formed on a substrate using a deposition process. The term "layer" is meant to include layers specific to the semiconductor industry, such as "barrier layer," "dielectric layer," and "conductive layer." The term "layer" is also meant to include layers found in technology outside of semiconductor technology, such as coatings on glass.

In the figures, the first digit of a reference number refers to the Figure in which it is used, while the remaining two digits of the reference number refer to the same or equivalent parts of embodiment(s) of the present disclosure used throughout the several figures. The scaling of the figures does not represent precise dimensions and/or dimensional ratios of the various elements illustrated herein.

As memory cells are scaled to smaller dimensions, distances between gate structures decrease. For a given amount of charge stored on a particular charge storage structure, e.g., a floating gate, capacitance increases as distances relative to the charge-storage structure decrease. Thus, associated capacitive coupling effects also increase. This increase in capacitive coupling results in greater interference between the floating gate of one cell, e.g., where charge is stored, and the floating gates of adjacent cells. Floating gate to channel capacitive coupling intensifies the problem of floating gate to floating gate coupling, and the interference caused thereby. The interference associated with this increased capacitive coupling becomes particularly problematic for 50 nanometer (nm) generation design rule and below for cell structures, e.g., cells separated by 50 nm or less. According to one or more embodiments of the present invention, memory cell structures are disclosed which should offset the effects of horizontal distance reductions, by increasing a vertical distance dimension between one cells storage node, e.g., floating gate, and storage nodes and/or channels in adjacent cells in order to mitigate capacitive coupling therebetween.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. In various embodiments, the array 100 includes a number of multilevel memory cells (MLCs).

As shown in FIG. 1, the memory array 100 includes row-select lines 103-1, . . . , 103-N and intersecting sense lines 105-1, 105-2, 105-3, . . . , 105-M. The indicators "M" and "N" are used to indicate that the array 100 can include a number of row-select lines and a number of sense lines. For ease of addressing in the digital environment, the number of row-select lines 103-1, . . . , 103-N and the number of sense lines 105-1, 105-2, 105-3, . . . , 105-M are usually each some power of two, e.g., 256 row-select lines by 4,096 sense lines.

Memory array 100 includes NAND strings 107-1, 107-2, 107-3, . . . , 107-M. Each NAND string includes non-volatile memory cells 109-1, . . . , 109-N, each located at an intersection of a row-select line 103-1, . . . , 103-N and a local sense line 105-1, 105-2, 105-3, . . . , 105-M. The non-volatile memory cells 109-1, . . . , 109-N of each NAND string 107-1, 107-2, 107-3, . . . , 107-M are connected in series, source to drain between a select gate source (SGS) transistor, e.g., a field-effect transistor (FET) 111, and a select gate drain (SGD) transistor, e.g., FET 113. Source select gate 111 is located at the intersection of a local sense line 105-1 and a source select line 115, while drain select gate 113 is located at the intersection of a local sense line 105-1 and a drain select line 117.

As shown in the embodiment illustrated in FIG. 1, a source of source select gate 111 is connected to a common source line 119. The drain of source select gate 111 is connected to the source of the memory cell 109-1 of the corresponding NAND string 107-1. The drain of drain select gate 113 is connected to the local sense line 105-1 for the corresponding NAND string 107-1 at drain contact 121-1. The source of drain select gate 113 is connected to the drain of the last memory cell 109-N, e.g., floating-gate transistor, of the corresponding NAND string 107-1.

In various embodiments, construction of non-volatile memory cells 109-1, . . . , 109-N includes a source, a drain, a floating gate or other charge storage layer, and a control gate. Non-volatile memory cells, 109-1, . . . , 109-N, have their control gates coupled to an associated row-select line, 103-1, . . . , 103-N, respectively. Thus, a row of the non-volatile memory cells are commonly coupled to a given row-select line, e.g., 103-1, . . . , 103-N. A column of the non-volatile memory cells 109-1, . . . , 109-N make up the NAND strings, e.g., 107-1, 107-2, 107-3, . . . , 107-M, coupled to a given local sense line, e.g., 105-1, 105-2, 105-3, . . . , 105-M, respectively. A NOR array architecture would be similarly laid out with the exception that the string of memory cells would be coupled in parallel between the select gates.

As will be described further below in connection with subsequent figures, various aspects of memory cell operational performance change as a NAND array architectures is scaled to smaller physical dimensions. These effects are due to quantities of charge being located in closer proximity to other memory cell structures, e.g., the charge stored on a floating gate of one memory cell is nearby the floating gate and channel of adjacent memory cells which tends to increase floating gate to floating gate, and floating gate to channel, interference due to capacitive coupling.

Figure 2:
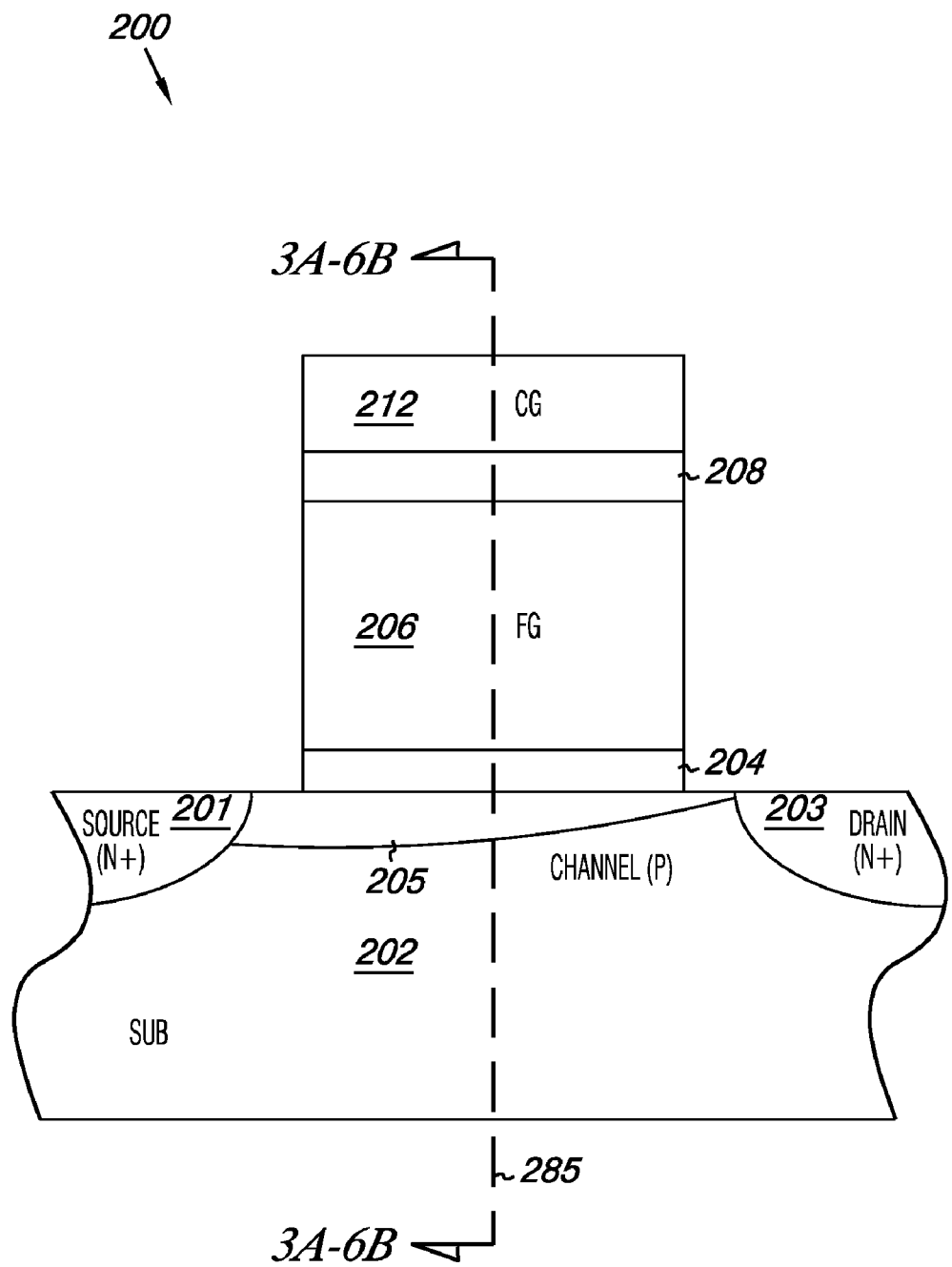
FIG. 2 illustrates a side view of a memory cell, taken along cut line 2-2 in FIG. 1, that can be included in an array of memory cells according to one or more embodiments of the present invention.

FIG. 2 illustrates a side view of a memory cell 200, taken along cut line 2-2 in FIG. 1, that can be included in an array of memory cells according to one or more embodiments of the present invention. FIG. 2 illustrates a source region 201 and a drain region 203 formed in a substrate 202 with a channel region 205 therebetween. In the example illustration of FIG. 2, the source region 201 and drain region 203 are n-type doped, formed in a p-type substrate 202, to form an n-channel device. One of ordinary skill in the art will appreciate, however, that the doping types can be switched to form a p-channel device. A first gate 206 is shown separated from the substrate 202 by a first dielectric 204. In one or more embodiments, described herein, the first gate can be a floating gate (FG). A second gate 212 is separated from the first gate 206 by a second dielectric 208. In one or more embodiments, the second gate can be a control gate (CG), as the same is known in association with non-volatile floating gate memory cells. While non-volatile floating gate memory cells are described in connection with one or more embodiments, the embodiments discussed herein are not limited to non-volatile floating gate memory cells.

Figure 3A:
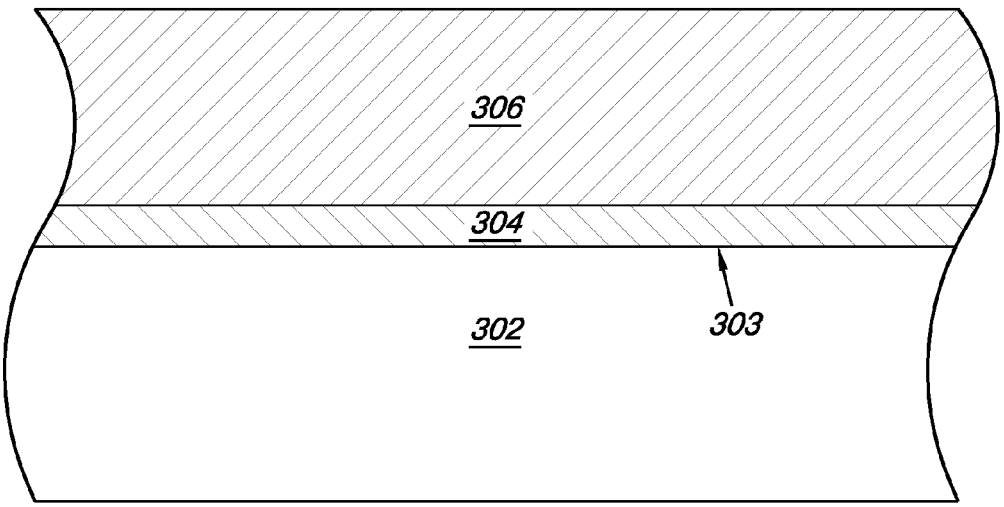
FIG. 3A illustrates a cross-sectional view of a portion of an array of memory cells, taken along cut line 3A-6B in FIG. 1, at a particular point in a semiconductor fabrication sequence according to a previous approach for fabricating memory cell structures.

FIG. 3A illustrates an end on cross-sectional view of a portion of an array of memory cells, taken along cut line 3A-6B in FIG. 1, at a particular point in a semiconductor fabrication sequence according to a previous approach for fabricating memory cell structures. FIG. 3A illustrates a dielectric layer 304 is formed over a surface 303 of a semiconductor substrate 302. As the reader will appreciate, the dielectric layer 304 can eventually serve as a tunnel dielectric and be formed from such materials as silicon dioxide ($SiO_2$), silicon nitrides ($SiN/Si_2N/Si_3N_4$), silicon oxynitrides ($SiO_xN_y$), high K dielectrics, etc. A conductive layer, e.g., a doped polysilicon gate layer, 306 is formed over the dielectric layer 304.

Figure 3B:
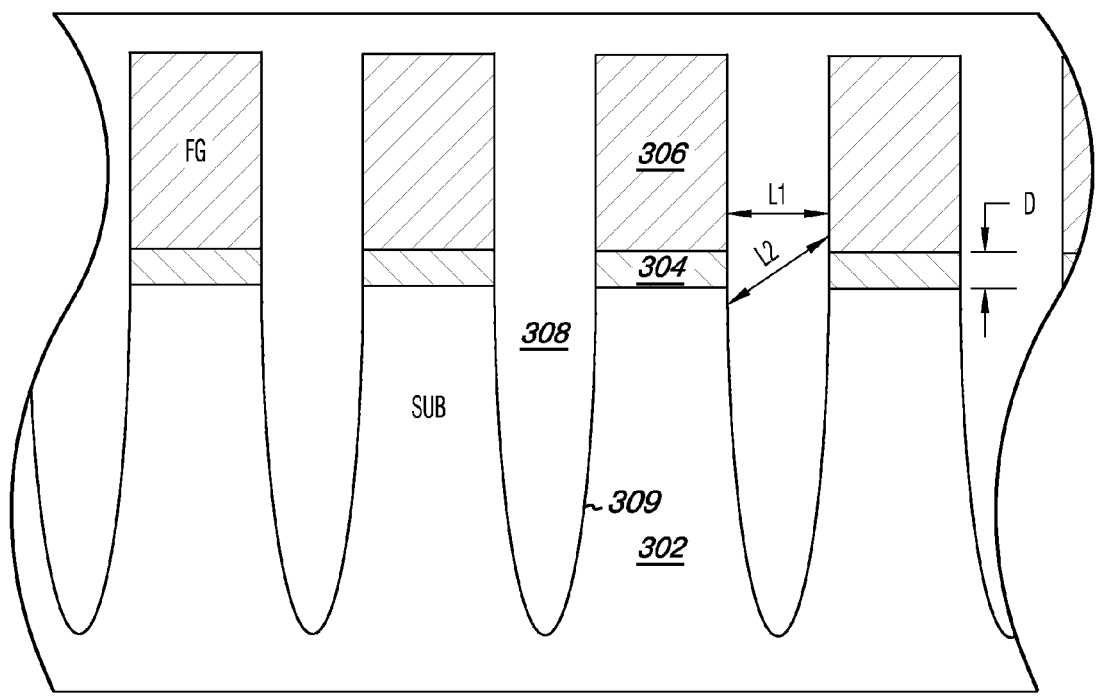
FIG. 3B illustrates a cross-sectional view of the portion of an array of memory cells, taken along cut line 3A-6B in FIG. 1, at another particular point in a semiconductor fabrication sequence according to a previous approach for fabricating memory cell structures.

FIG. 3B illustrates a cross-sectional view of the portion of an array of memory cells from FIG. 3A, taken along cut line 3A-6B in FIG. 1, at another particular point in a semiconductor fabrication sequence according to a previous approach for fabricating memory cell structures. As shown in FIG. 3B isolation regions 309 have been formed between adjacent columns of cells running into and out of the drawing sheet, e.g., columns 107-1, 107-2, etc., in FIG. 1, to reduce parasitic capacitance and/or cross talk between adjacent cells. As the reader will appreciate, the source and drain regions for these cell structures, e.g., 201 and 203 in FIG. 2, would be located into and out of the drawing sheet respectively, hence not shown. One of ordinary skill in the art will appreciate the manner in which the isolation regions 309 can be formed by photolithographic etching, for example, to form trenches through the conductive 306 and dielectric 304 layers, and into the substrate (SUB) 302, e.g., using a shallow trench isolation (STI) process, etc. As shown in FIG. 3B, the isolation regions 309 can be filled with a dielectric material 308.

In FIG. 3B the isolation regions 309 have separated the conductive layer 306 to form gate structures 306 above semiconductor substrate pillars 302. As the reader will appreciate, the gate structures 306 can be a floating gate structure 306 for a floating gate non-volatile memory cell. In FIG. 3B, each respective floating gate structure 306 is separated from a respective semiconductor substrate pillars 302 by a dielectric 304. The dielectrics 304 separating the floating gate structures 306 from the semiconductor substrate pillars 302 have a particular thickness (D). Adjacent floating gates 306 are illustrated as separated by a particular horizontal distance, i.e., length (L1).

As one of ordinary skill in the art will appreciate source and drain regions, e.g., 201 and 203 in FIG. 2, can be formed in the semiconductor substrate pillars 302 on opposing sides of the floating gate structures 306, e.g., into and out of the page (not shown), forming a channel region therebetween underneath the dielectrics 304 in the semiconductor substrate pillars 302 where conduction can be made to occur. As the reader will appreciate, such source and drain regions, 201 and 203 in FIG. 2, are differentially doped from the channel formed between in the semiconductor substrate pillars 302 to create appropriate conduction characteristics.

As shown in FIG. 3B, in addition to a separation distance L1 between adjacent floating gate structures 306 and a dielectric thickness D separating the floating gate structures 306 from the semiconductor substrate pillars 302, a distance, i.e., length (L2), exists between the floating gate structure 306 of one cell and the channel in the semiconductor substrate pillar 302 of an adjacent cell. As mentioned above, a suitable dielectric material 308, e.g. oxide-nitride-oxide (ONO), provides isolation between the floating gate structure 306 of one cell and the channel in the semiconductor substrate pillar 302 of an adjacent cell.

Figure 3C:
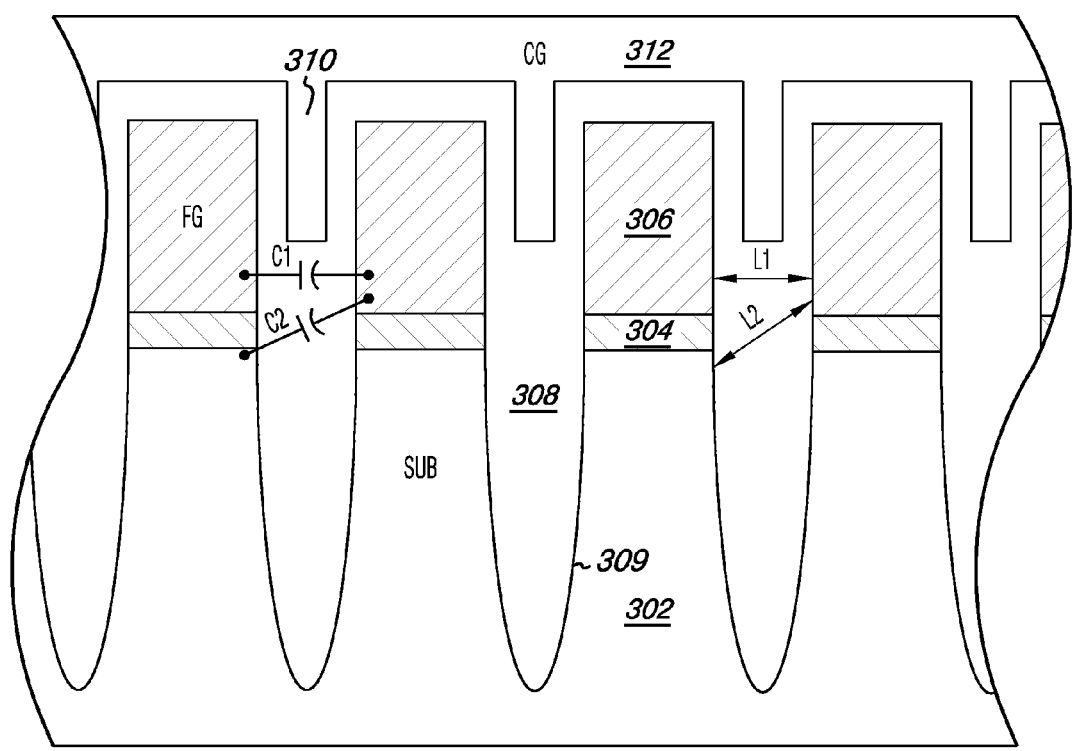
FIG. 3C illustrates a cross-sectional view of the portion of an array of memory cells, taken along cut line 3A-6B in FIG. 1, at a particular point in a semiconductor fabrication sequence according to a previous approach for fabricating memory cell structures.

FIG. 3C illustrates a cross-sectional view of the portion of the array of memory cells from FIG. 3B, taken along cut line 3A-6B in FIG. 1, at another particular point in a semiconductor fabrication sequence according to a previous approach for fabricating memory cell structures. As shown in FIG. 3C a conductive layer, e.g., polysilicon layer, 312 has been deposited across the number of floating gate structures 306. As shown in FIG. 3C, the conductive layer 312 is separated from the floating gate structures 306 by the dielectric material 308. A portion of the dielectric material 308 may have been removed in regions 310, e.g., using known etch techniques, to allow the conductive layer 312 to fill partially between the floating gate structures 306.

As the reader will appreciate, the conductive layer 312 can serve as a control gate connected to a row select line for a row of cells in an array, e.g., row select lines 103-1, . . . , 103-N shown in FIG. 1. In this arrangement, each semiconductor substrate pillar 302 shown would be part of a column of cells, e.g., 107-1, 107-2, etc. shown in FIG. 1, running into and out of the drawing sheet. These columns of cells in the array would further be coupled to sense lines, e.g., sense lines 105-1, 105-2, etc., as shown in FIG. 1.

FIG. 3C illustrates a first capacitive coupling (C1) (corresponding to distance L1) which occurs between floating gates 306 for adjacent columns of cells, e.g., columns of cells running into and out of the drawing sheet. FIG. 3C also illustrates a second capacitive coupling (C2) (corresponding to distance L2) which occurs between the floating gates 306 for adjacent columns of cells, e.g., columns running into and out of the drawing sheet, and channel regions located in the semiconductor substrate pillars 302 for adjacent cells. The capacitor symbols are not intended to indicate that a capacitor structure is intentionally formed, but rather that adjacent gate structures and semiconductor substrate channel regions, e.g., 306 and 302, are inherently capacitively coupled by their proximity to one another. Such capacitive coupling occurs between each of the adjacent columns of cells running into and out of the drawing sheet.

FIGS. 4A-D illustrates a cross-sectional views of a portion of an array of memory cells, taken along cut line 3A-6B in FIG. 1, at various particular points in a semiconductor fabrication sequence according to one or more embodiments of the present invention. Although FIG. 1, is referenced herein, and illustrates a NAND architecture for an array of memory cells, embodiments are not limited to either a NAND architecture or to floating gate non-volatile memory cells. Features of one or more embodiments described herein can be used in NOR type architectures as well as for an array of memory cells in other types of memory devices. The description of FIGS. 4A-4D is intended to illustrate one possible technique for forming semiconductor substrate pillars to different heights according to one or more embodiments of the present invention. The technique shown in FIGS. 4A-4D is not to the exclusion of other suitable techniques as will be recognized by those of skill in the art upon reading this disclosure.

Although, for ease of illustration, the embodiments of the FIGS. 4A-D, 5 and 6A-6B, will be discussed in relation to a non-volatile floating gate memory cell, one of ordinary skill in the art will appreciate that embodiments of the present disclosure are not so limited. In one or more embodiments, a memory cell, whose fabrication is illustrated in the figures that follow, includes a first dielectric, e.g., $SiO_2$, separating a charge storage node, e.g., a floating gate, from the surface of a semiconductor substrate channel region, the channel region separating source and drain regions. In one or more embodiments, electron charge is stored in the floating gate, which can be associated for example with direct tunneling of the charge by methods such as direct Fowler-Nordheim tunneling or channel hot electron injection, from the substrate to the floating gate through the first dielectric layer, which causes a shift in the threshold voltage for the memory cell. The charge storage node, e.g., a floating gate, is further separated from a gate, e.g., control gate, by a second dielectric layer. In operation, current flow in the memory cell can be between the source and drain regions. The control gate is provided to turn the device on and provide a channel in the device such that a potential can be established between the source/drain regions. The floating gate is charged and stores the charge to control the threshold turn-on voltage of the device.

Figure 4A:
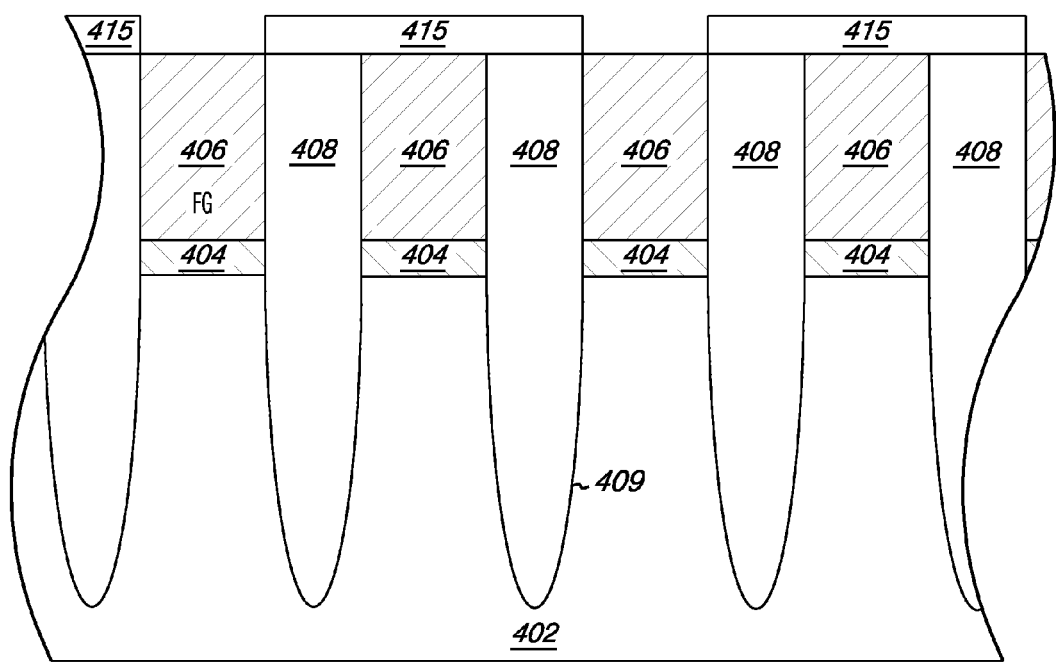
FIG. 4A illustrates a cross-sectional view of a portion of an array of memory cells, taken along cut line 3A-6B in FIG. 1, at a particular point in a semiconductor fabrication sequence according to one or more embodiments of the present invention.

FIG. 4A illustrates a cross-sectional view of a portion of an array of memory cells, taken along cut line 3A-6B in FIG. 1, at a particular point in a semiconductor fabrication sequence according to one or more embodiments of the present invention. The portion of the array shown in FIG. 4A is analogous to the portion of the array shown in FIG. 3B. That is, the portion of the array shows a number semiconductor substrate pillars 402 each having a floating gate 406 formed above and separated from the semiconductor substrate pillars by a dielectric 404. Isolation regions 409 are illustrated, also filled with a suitable dielectric material 408, separating columns of memory cells running into and out of the drawing sheet. In the embodiment of FIG. 4A, alternating pillars are masked, e.g., represented by photolithographic masks 415.

Figure 4B:
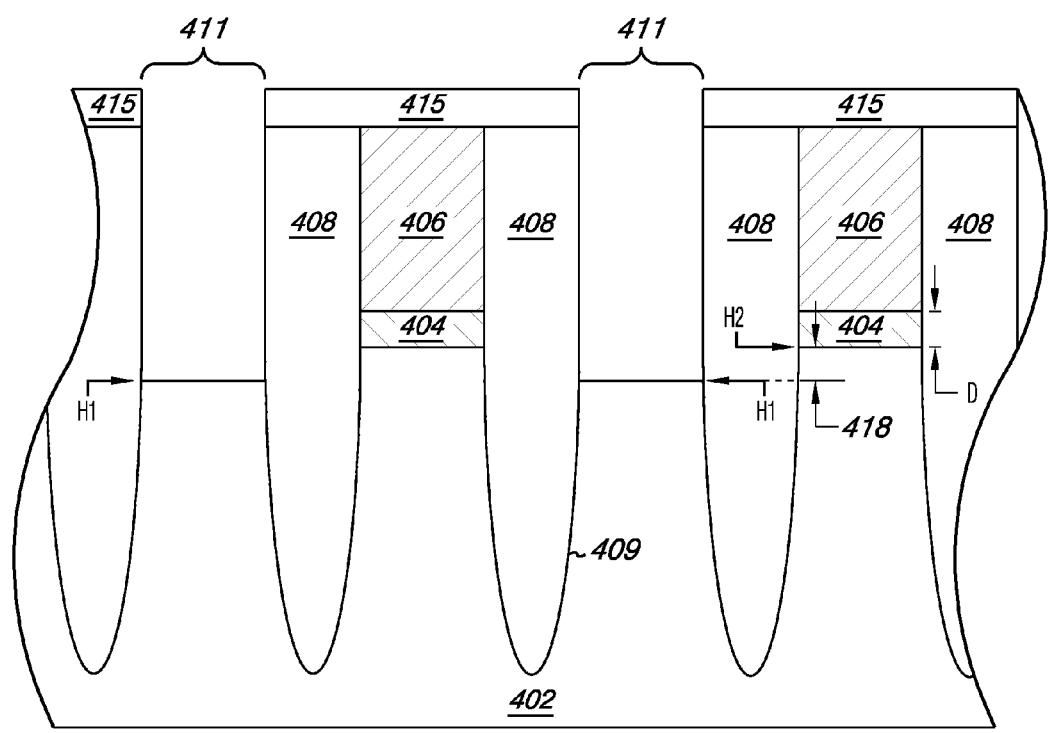
FIG. 4B illustrates a cross-sectional view of the portion of an array of memory cells, taken along cut line 3A-6B in FIG. 1, at another particular point in a semiconductor fabrication sequence according to one or more embodiments of the present invention.

FIG. 4B illustrates a cross-sectional view of the portion of the array of memory cells from FIG. 4A, taken along cut line 3A-6B in FIG. 1, at another particular point in a semiconductor fabrication sequence according to one or more embodiments of the present invention. In FIG. 4B, through openings 411 in the mask 415, the exposed floating gate material 406, the dielectric material 404, and a portion of the semiconductor substrate material 402 have been removed. One of ordinary skill in the art will appreciate the manner in which exposed floating gate material 406, the dielectric material 404, and a portion of the semiconductor substrate material 402 can be removed using directional and selective etching techniques as the same are known. The structure is now as shown in FIG. 4B with a first group of semiconductor substrate pillars having a surface fabricated to a first elevation in the plane of the substrate, e.g., first height (H1), and a second group of semiconductor substrate pillars having a surface fabricated to a second elevation in the plane of the substrate, e.g., second height (H2).

While the term "height" is used in reference to the elevation of a pillar surface with respect to a reference in the plane of the substrate material 402, height does not necessarily connote a vertical direction. Height, as used herein, is taken to be in the direction by which a pillar projects from the plane of the substrate material 402, e.g., perpendicular to the plane of the substrate material 402 from which the pillar is fabricated. As shown in FIG. 4B, the second height (H2) is greater than the first height (H1) by a distance represented by reference numeral 418.

In the embodiment of FIG. 4B, the floating gates 406 and dielectrics 404 remain above the semiconductor substrate pillars which were masked, e.g., have a height (H2). In one or more embodiments, the difference in height 418 between the first height (H1) and the second height (H2) is at least the equivalent of a thickness (D) of the dielectric 404.

Figure 4C:
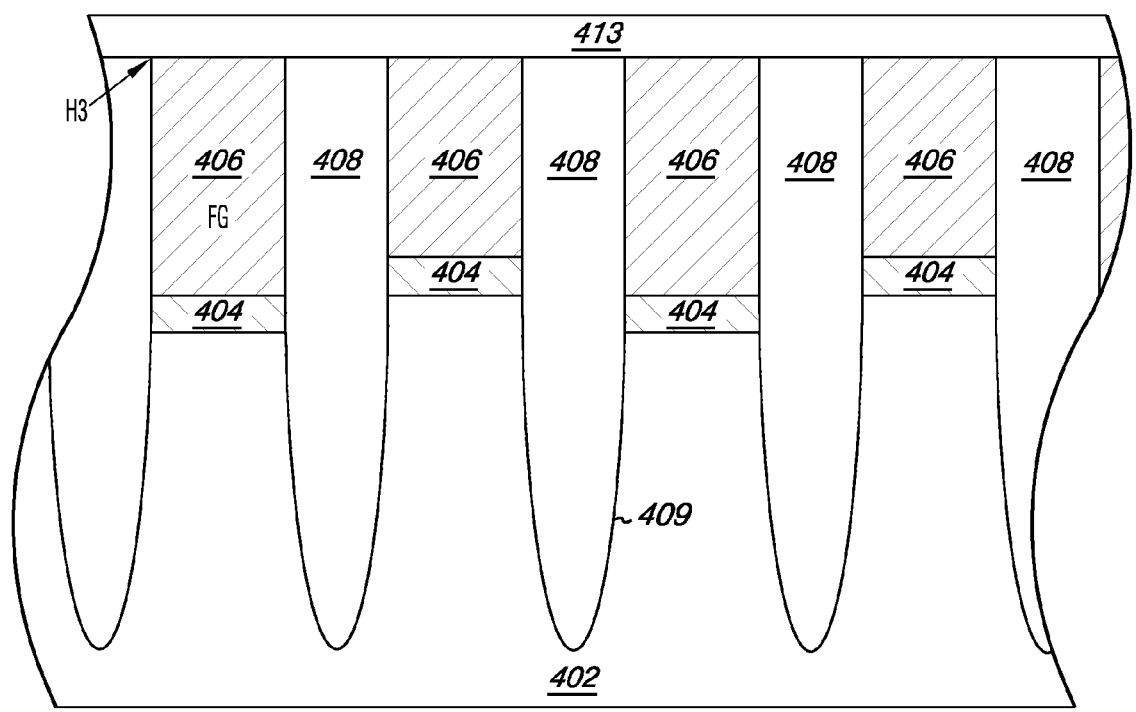
FIG. 4C illustrates a cross-sectional view of the portion of an array of memory cells, taken along cut line 3A-6B in FIG. 1, at another particular point in a semiconductor fabrication sequence according to one or more embodiments of the present invention.

FIG. 4C illustrates a cross-sectional view of the portion of the array of memory cells from FIG. 4B, taken along cut line 3A-6B in FIG. 1, at another particular point in a semiconductor fabrication sequence according to one or more embodiments of the present invention. In the embodiment of FIG. 4C, the mask 415, shown in FIG. 4B, is once again used to deposit dielectric 404 and floating gate 406 material in the openings 411. The dielectric 404 material deposited in the openings 411 can be deposited to a thickness equivalent to a thickness (D) as the dielectric material above the semiconductor substrate pillars which were masked. In the embodiment of FIG. 4C the floating gate 406 material deposited in the openings can be deposited to a level equivalent to that of the floating gates 406 which were masked to fill the openings 411. The floating gate 406 material could also be deposited in the openings 411 to a level greater than even to the floating gates which were masked and the portion of the array then could be planarized.

One of ordinary skill in the art will appreciate the manner in which the dielectric 404 and floating gate material 406 can be deposited in the opening using chemical vapor deposition (CVD), physical vapor deposition (PVD) or other suitable technique. One of ordinary skill in the art will further appreciate the manner in which the materials can be planarized using a chemical mechanical planarization (CMP) process, or other suitable technique. Embodiments, however, are not so limited.

In the embodiment shown in FIG. 4C each of the floating gates 406 have a surface opposite dielectric 404 fabricated to a substantially equivalent elevation in the plane of the substrate, e.g., height H3. This structure can then be covered with a dielectric material 413 such as dielectric material 408 separating the columns of cells running into and out of the drawing sheet. The structure is now as appears in FIG. 4C.

Figure 4D:
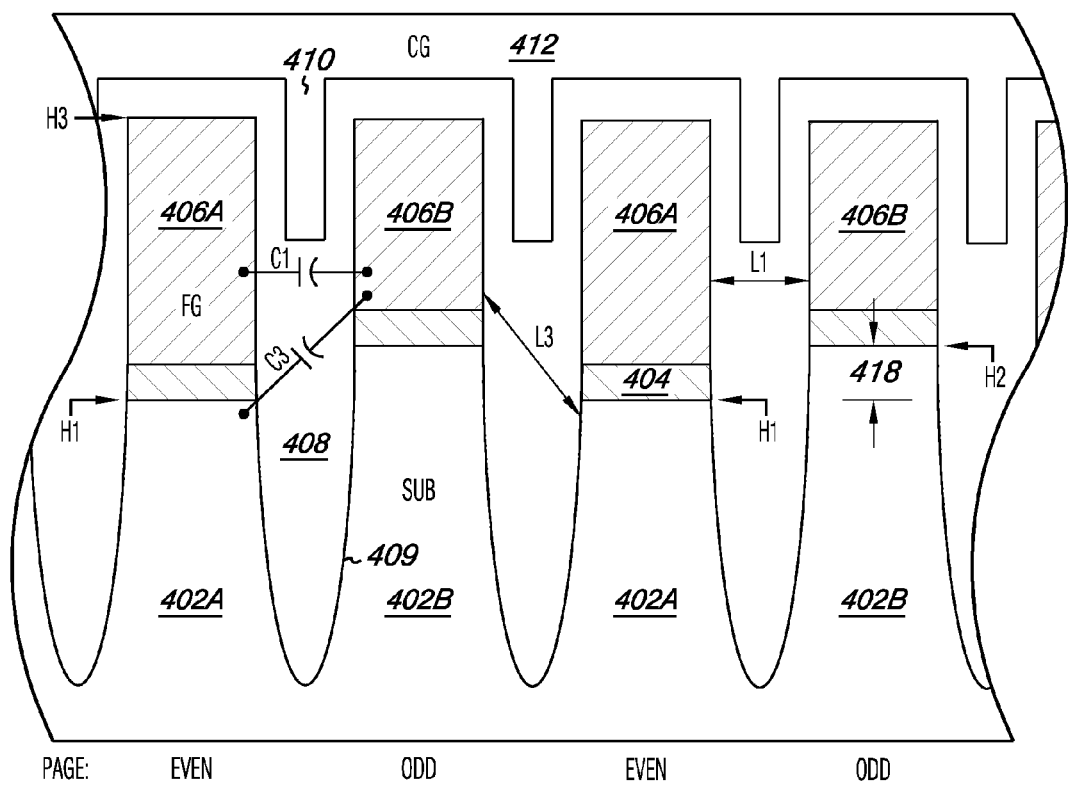
FIG. 4D illustrates a cross-sectional view of the portion of an array of memory cells, taken along cut line 3A-6B in FIG. 1, at another particular point in a semiconductor fabrication sequence according to one or more embodiments of the present invention.

FIG. 4D illustrates a cross-sectional view of the portion of an array of memory cells, taken along cut line 3A-6B in FIG. 1, at another particular point in a semiconductor fabrication sequence according to one or more embodiments of the present invention. In FIG. 4D, a sequence of processing steps can be performed similar to that described above in connection with FIG. 3C.

That is, as shown in FIG. 4D, a conductive layer, e.g., polysilicon layer, 412 has been deposited across the number of floating gate structures 406. As shown in FIG. 4D, the conductive layer 412 is separated from the floating gate structures 406 by the dielectric material 408. A portion of the dielectric material 408 may have been removed in regions 410, e.g., using known etch techniques, to allow the conductive layer 412 to fill partially between the floating gate structures 406.

As described in connection with FIG. 3C, the conductive layer 412 of FIG. 4D can serve as a control gate connected to a row select line, parallel to the plane of the drawing sheet, for a row of cells in an array, e.g., row select lines 103-1, . . . , 103-N shown in FIG. 1. In this arrangement, each semiconductor substrate pillar 402 shown would also be part of a column of cells, e.g., 107-1, 107-2, etc. shown in FIG. 1, running into and out of the drawing sheet. These columns of cells in the array would further be coupled to sense lines, e.g., sense lines 105-1, 105-2, etc., as shown in FIG. 1.

FIG. 4D illustrates a first capacitive coupling (C1) (corresponding to distance L1) which occurs between floating gates 406 for adjacent columns of cells, e.g., columns of cells running into and out of the drawing sheet. However, according to the one or more embodiments of the present disclosure there is now a distance (L3), which is greater than distance L2 separating a floating gate 406 in one column of cells and a channel in the semiconductor substrate pillar 402 in an adjacent column of cells. This distance (L3) has associated with it a third capacitive coupling (C3) which will be weaker than the aforementioned C2 on account of the distance L3 being greater than that of L2 for equivalent semiconductor substrate pillar spacing, e.g., in a 50 nm operation design rule, due to the difference in height 418 between the group of semiconductor substrate pillars having first heights (H1) and the group of semiconductor substrate pillars having second heights (H2).

In the embodiment of FIG. 4D, a first group of semiconductor substrate pillars having a first height (H1) are labeled 402A and included along a row of memory cells, running parallel to the plane of the drawing sheet, coupled to a particular select line 412, e.g., select lines 103-1, 103-2, etc., shown in FIG. 1. A second group of semiconductor substrate pillars having a second height (H2) are labeled 402B and are also included along the row of memory cells coupled to the particular select line. In the embodiment shown in FIG. 4D, the first group of semiconductor substrate pillars having the first height (H1) and the second group of semiconductor substrate pillars having the second height (H2) alternate between adjacent columns of cells running into and out of the drawing sheet. In one or more embodiments, within a given column of cells running into and out of the drawing sheet, e.g., 107-1, 107-2, etc., as shown in FIG. 1, all cells will be associated with semiconductor substrate pillars having a first height (H1), or all cells will be associated with semiconductor substrate pillars having a second height (H2). As described below, however, embodiments are not so limited.

The embodiment of FIG. 4D thus illustrates floating gates 406A being associated with semiconductor pillars fabricated to the first height (H1) 402A and illustrates floating gates 406B being associated with semiconductor pillars fabricated to the second height (H2) 402B. In the embodiment of FIG. 4D the thickness of floating gates 406A is greater than the thickness of floating gates 406B. As described in more detail in connection with FIG. 5, embodiments are not so limited. Floating gates 406A and 406B are one possible embodiment of a charge storage node, e.g., a structure for storing charge. However, embodiments of the present invention are not so limited, and the present disclosure is intended to encompass other structures and arrangements for storing charge as a means for implement information storage and retrieval. Thus, a gate associated with a charge storage node may be embodied as a control gate (as shown in FIG. 4D) for example, or some other structure configured to control operation of the associated charge storage node.

Indicated below the cross-sectional view of the array of memory cells is a tabulation of "PAGE" and "PROGRAM ORDER" nomenclature corresponding to columns of cells running into and out of the drawing sheet as associated with semiconductor substrate pillars having either a first (H1) or a second height (H2). In one or more embodiments, alternate columns of cells associated with semiconductor substrate pillars having either a first (H1) or a second height (H2) can be associated with different data pages. That is, in the embodiment shown in FIG. 4D, columns of cells associated with semiconductor substrate pillars having a first height (H1) are associated with EVEN data pages and columns of cells associated with semiconductor substrate pillars having a second height (H2) are associated with ODD data pages. Hence, in the embodiment of FIG. 4D, along the particular row select line 412, the first group of cells associated with semiconductor substrate pillars having the first height (H1) 402A are shown alternating with the second group of cells associated with semiconductor pillars having the second height (H2) 402B.

In one or more embodiments, as reflected in FIG. 4D, the EVEN data pages may be programmed together first, as indicated by the PROGRAM ORDER numeral "1", and ODD data pages may be programmed together second, as indicated by the PROGRAM ORDER numeral "2". Embodiments of the present invention, however, are not limited to the specific order set forth above in this example. That is, cells associated with semiconductor substrate pillars having the first height (H1) 402A could be associated with ODD data pages and be programmed first and cells associated with semiconductor substrate pillars having the second height (H2) could be associated with EVEN data pages and be programmed second, etc.

As one of ordinary skill in the art will appreciate upon reading this disclosure, grouping alternate columns of cells running into and out of the drawing sheet together into particular groups of data cells, e.g., a page, and programming a particular group together can reduce interference by avoiding adjacent floating gates along a particular select line being simultaneously operated, hence attenuating capacitive coupling therebetween. For example, since floating gates along a particular select line are not being simultaneously being operated, e.g., programmed or erased, the impact of operating voltages applied to any given cell on that of its neighboring cells may be mitigated.

Figure 5:
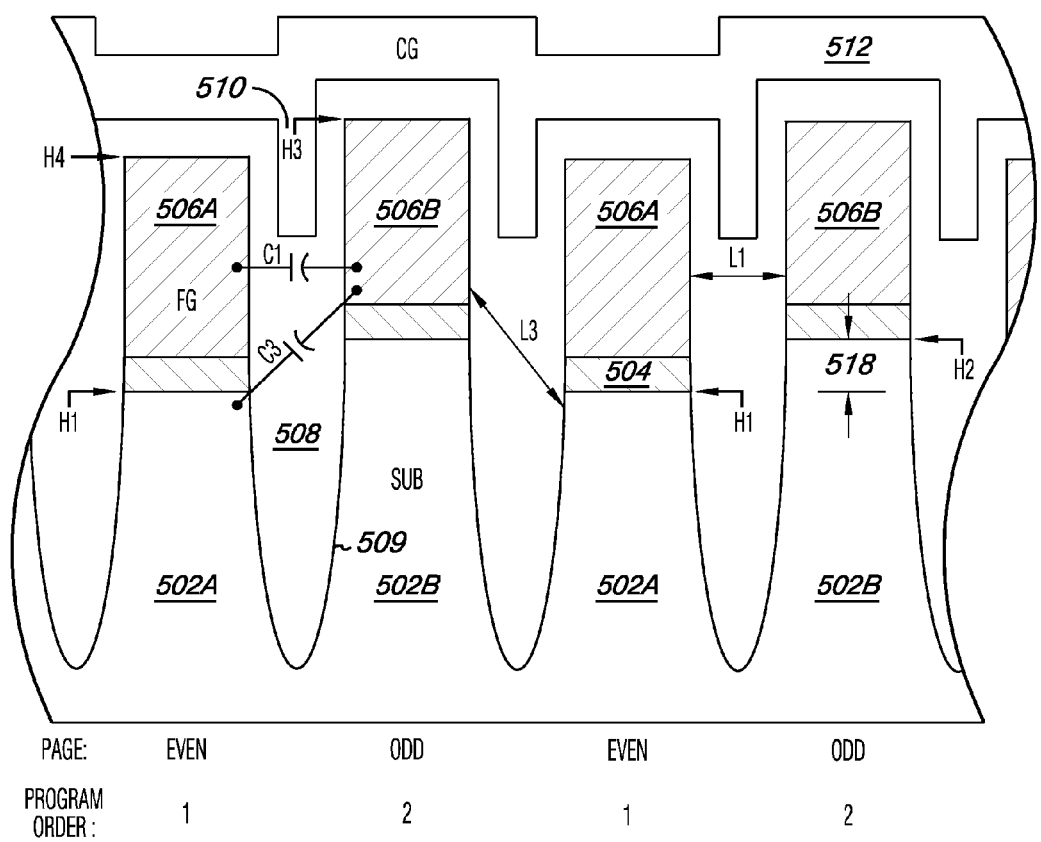
FIG. 5 illustrates a cross-sectional view of a portion of an array of memory cells, taken along cut line 3A-6B in FIG. 1, at a particular point in a semiconductor fabrication sequence according to one or more embodiments of the present invention.

FIG. 5 illustrates a cross-sectional view of a portion of an array of memory cells, taken along cut line 3A-6B in FIG. 1, at a particular point in a semiconductor fabrication sequence according to one or more embodiments of the present invention. The embodiment of FIG. 5 illustrates an embodiment similar to that of FIG. 4D in that adjacent columns of cells running into and out of the drawing sheet alternate between columns of cells associated with semiconductor pillars having a first height (H1) 502A and cells associated with semiconductor pillars having a second height (H2) 502B. However, in the embodiment of FIG. 5, the deposition process described in connection with FIG. 4C is different.

In the embodiment of FIG. 5, the dielectric 504 deposited in the openings, e.g., 411 shown in FIG. 4B, may be deposited to a uniform thickness, for example a thickness equivalent to thickness (D) in FIG. 4B, for those semiconductor pillars that were masked. However, by appropriate use of masking, the floating gate 506A material for semiconductor substrate pillars fabricated to the first height (H1) is only deposited in the openings, e.g., 411 shown in FIG. 4B, to reach a height (H4), which is reduced from the elevation, e.g., height H3, to which floating gate 506B material for semiconductor substrate pillars fabricated to the second height (H2) is deposited. In one or more embodiments, the floating gate 506A material for semiconductor pillars fabricated to the first height (H1) is deposited such that the thickness of the floating gate material 506A is equivalent to the thickness of the floating gate 506B material for semiconductor substrate pillars fabricated to the second height (H2), which were masked.

Figure 6A:
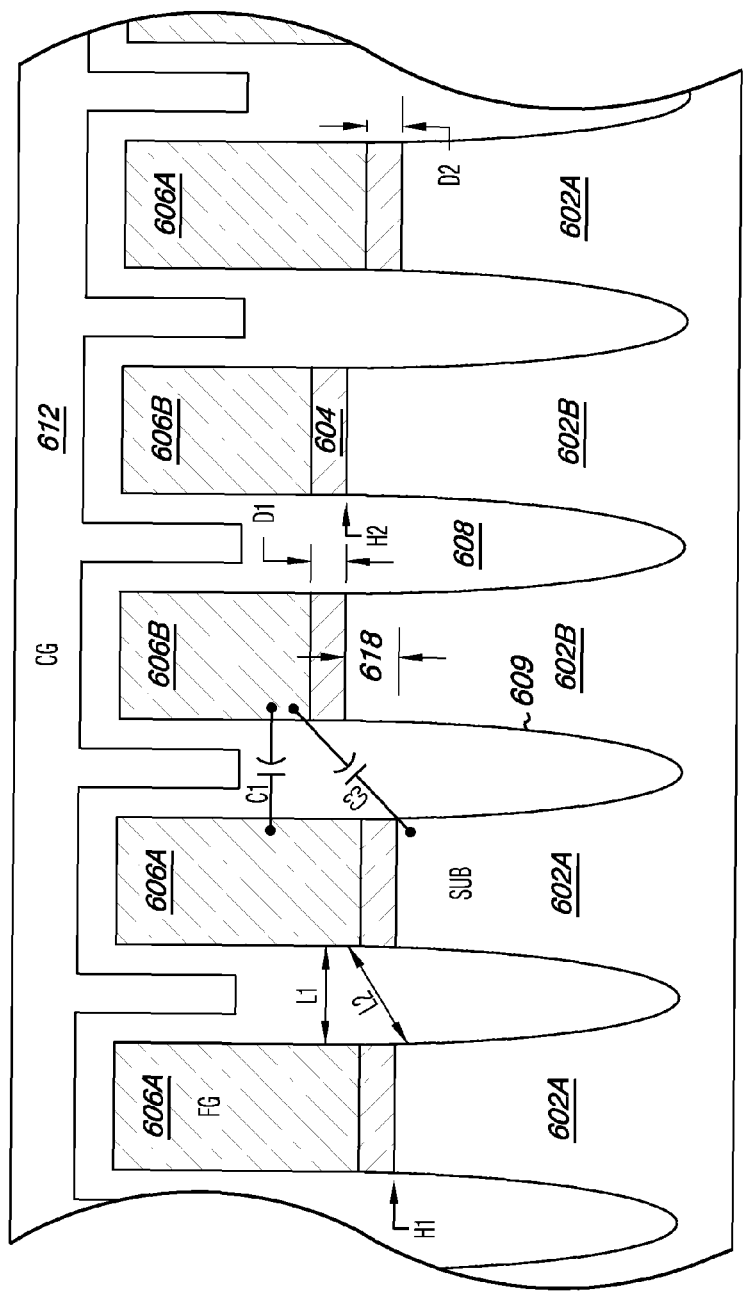
FIG. 6A illustrates a cross-sectional view of a portion of an array of memory cells, taken along cut line 3A-6B in FIG. 1, at a particular point in a semiconductor fabrication sequence according to one or more embodiments of the present invention.

FIG. 6A illustrates a cross-sectional view of a portion of an array of memory cells, taken along cut line 3A-6B in FIG. 1, at a particular point in a semiconductor fabrication sequence according to one or more embodiments of the present invention. The embodiment of FIG. 6A illustrates a cross-sectional view along a particular select line 612 in which the first group of cells 602A associated with semiconductor substrate pillars having a first height (H1) includes at least two adjacent cells along the given select line 612 and the second group of cells 602B associated with semiconductor substrate pillars having a second height (H2) includes at least two adjacent cells along the given select line.

As the one of ordinary skill in the art will appreciate upon reading this disclosure, the embodiment of FIG. 6A can be formed by adjusting a mask, e.g., mask 415 as described in connection with FIG. 4A, to expose two or more adjacent cells along the particular select line 612 and hence forming two or more adjacent cells along the particular select line 612 to the same of one or more different heights, e.g., height (H1) or height (H2). Although forming semiconductor substrate pillars to two different heights (H1) and (H2) has been discussed herein. One of ordinary skill in the art will appreciate that more than two different semiconductor pillar heights can be achieved according to one or more embodiments of the present invention.

In one or more embodiments, adjusting a mask, e.g., mask 415 as described in connection with FIG. 4A, to expose two or more adjacent cells along the particular select line 612 and hence forming two or more adjacent cells along the particular select line 612 to the same of one or more different heights, e.g., height (H1) or height (H2), may provide an easier processing sequence in certain fabrication environments.

In the embodiment of FIG. 6A, adjacent floating gates along a particular select line 612, e.g., 606A/606A and 606B/606B, as associated with semiconductor substrate pillars having a first height (H1) and second height (H2) respectively, are capacitively coupled across a distance L1, as indicated, for example, by capacitance C1 in FIG. 6A. In this embodiment, floating gates 606A are capacitively coupled to semiconductor substrate pillars 602A across a distance L2, as has been associated with a capacitance C2 (described above). However, floating gates 606B are capacitively coupled to semiconductor substrate pillars 602A across a greater distance, e.g., L3, which as described above results in a weaker capacitive C3.

The embodiment of FIG. 6A illustrates the floating gates, 606A and 606B associated with semiconductor substrate pillars having the first and the second heights, H1 and H2, having the same vertical height, e.g., H3 similar to that shown in the embodiment of FIG. 4D. Embodiments of FIG. 6A, however, are not so limited and embodiments may include forming the floating gates 606A associated with semiconductor substrate pillars having the first height (H1) to a height (H4) and forming floating gates 606B associated with semiconductor substrate pillars having the second height (H2) to a height (H3) such that floating gates 606A and 606B have a substantially equivalent height as the same has been described in connection with FIG. 5.

Figure 6B:
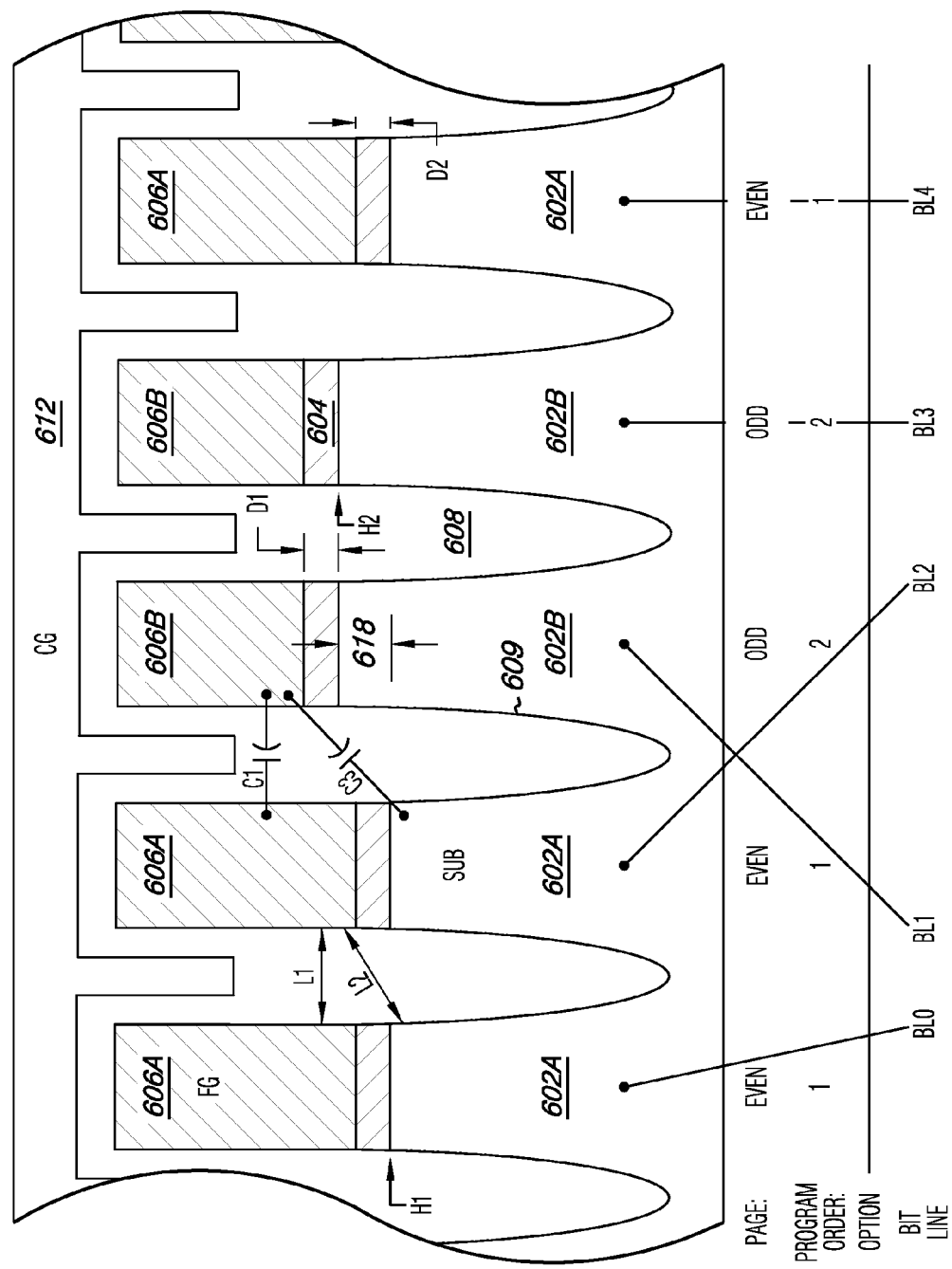
FIG. 6B illustrates a cross-sectional view of the portion of the array of memory cells from FIG. 6A illustrating a particular sense line mapping sequence according to one or more embodiments of the present invention.

FIG. 6B illustrates a cross-sectional view of the portion of the array of memory cells from FIG. 6A illustrating a particular sense line mapping sequence according to one or more embodiments of the present invention. Like FIG. 4D, FIG. 6B indicates below the cross-sectional view of the array of memory cells a tabulation of "PAGE" and "PROGRAM ORDER" nomenclature corresponding columns of cells running into and out of the drawing sheet as associated with semiconductor substrate pillars having either a first (H1) or a second height (H2). However, the embodiment of FIG. 6B provides an alternative mapping to the sense lines, e.g., bit lines BL0, BL1, BL2, etc., associated in numerical order with the columns of cells running into and out of the drawing sheet.

The sense lines, e.g., bit lines BL0, BL1, BL2, etc., may be physically formed in a fabrication sequence to be sequentially ordered with each adjacent column of cells running into and out of the drawing sheet. However, as indicated above, it may be desirable to associate a first group of cells associated with semiconductor pillars having a first height, e.g., height (H1), with a first programming order and a second group of cells associated with semiconductor substrate pillars having a second height, e.g., height (H2), with a second programming order. According to the embodiment described in connection with FIG. 6B, adjacent along a particular select line 612 a first group of cells 602A associated with semiconductor substrate pillars having a first height (H1) may include at least two adjacent cells along the given select line 612 and the second group of cells 602B associated with semiconductor substrate pillars having a second height (H2) may include at least two adjacent cells along the given select line 612. Thus, physically adjacent sense lines, e.g., bit lines BL0 and BL1, may both be physically connected to columns of cells associated with semiconductor pillars having a the same height, e.g., height (H1).

If the programming is designed to use a programming order which alternates between even and odd numbered sense lines, e.g., bit lines BL0 and BL1, the order would be programming similar height semiconductor substrate pillars in both PROGRAM ORDER "1" and PROGRAM ORDER "2" according to physical topographical layout and methodology of FIG. 4D where columns alternate assignment between EVEN and ODD data pages. If as described above in connection with FIG. 4D it is desirable to program a first group of cells associated with semiconductor substrate pillars having a first height (H1) as like pages, e.g., as EVEN or ODD pages, and to program a second group of cells associated with semiconductor substrate pillars having a second height (H2) as like pages, e.g., as EVEN or ODD pages, then mapping using control circuitry is employed according to one or more embodiments.

Figure 7:
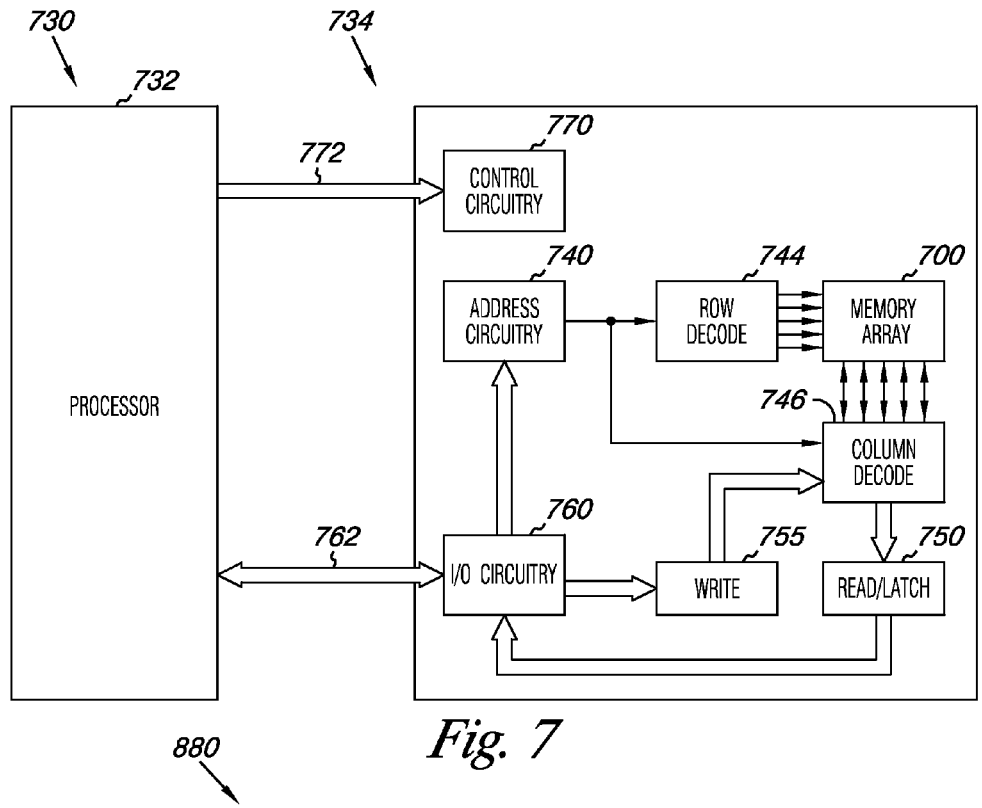
FIG. 7 is a functional block diagram of an memory system having at least one memory device in accordance with one or more embodiments of the present disclosure.

For example, in one embodiment control circuitry, e.g., 770 in FIG. 7, is used for an array of cells arranged in rows coupled to select lines and columns coupled to sense lines, and for cells coupled to a given select line 612 to associate a first group of columns with cells associated with semiconductor substrate pillars 602A having the first height H1 with a first group of sense lines, e.g., EVEN bit lines BL0, BL2, BL4, etc. And, control circuitry, e.g., 770 in FIG. 7, is used for cells coupled to the given select line 612 to associate a second group of columns with cells associated with semiconductor substrate pillars 602B having the second height H2 with a second group of sense lines, e.g., ODD bits lines BL1, BL3, etc. As shown in the embodiment of FIG. 6B, the control circuitry, e.g., 770 in FIG. 7, associating the first and the second group of columns, e.g., columns associated with semiconductor substrate pillars 602A and 602B, operates to associate non-adjacent sense lines, e.g., bit lines BL0 and BL2 with adjacent cells 602A along select line 612 as EVEN pages having a PROGRAM ORDER "1". Likewise, the control circuitry, e.g., 770 in FIG. 7, associating the first and the second group of columns, e.g., columns associated with semiconductor substrate pillars 602A and 602B, operates to associate non-adjacent sense lines, e.g., bit lines BL1 and BL3 with adjacent cells 602B along select line 612 as ODD pages having a PROGRAM ORDER "2".

Hence, according to one or more embodiments, the control circuitry operates to map the first group of non-adjacent sense lines, e.g., BL0/BL2, to adjacent columns having the first group of cells associated with semiconductor substrate pillars having a first height (H1), and operates to map the second group of non-adjacent sense lines, e.g., and BL1/BL3, to adjacent columns having the second group of cells associated with semiconductor substrate pillars having a second height (H2).

In this manner, as reflected in FIG. 6B, the EVEN data pages associated with semiconductor substrate pillars having a first height (H1) may be programmed together first, as indicated by the PROGRAM ORDER numeral "1" and ODD data pages associated with semiconductor substrate pillars having a second height (H2) may be programmed together second, as indicated by the PROGRAM ORDER numeral "2". Again, embodiments of the present invention, however, are not limited to the specific order set forth above in this example. That is, cells associated with semiconductor substrate pillars having the first height (H1) 402A could be associated with ODD data pages and be programmed second and cells associated with semiconductor substrate pillars having the second height (H2) could be associated with EVEN data pages and be programmed first, etc.

As one of ordinary skill in the art will appreciate upon reading this disclosure, grouping particular columns of cells running into and out of the drawing sheet together into particular groups of data cells, e.g., a page, and programming a particular group together can reduce interference by avoiding adjacent floating gates along a particular select line from being simultaneously operated, hence attenuating capacitive coupling therebetween. That is, floating gate 602A associated with BL2 will be programmed at a different time from floating gate 602A associated with BL0, as associated physically with the next adjacent sense line in the programming order, but still be mapped by control circuitry to the PROGRAM ORDER "1".

FIG. 7 illustrates a memory system 730, which includes a processor 732 and is coupled to a memory device 734 that includes an array of memory cells 701, e.g., a memory array such as array 100 shown in FIG. 1, which includes one or more embodiments of the present invention. The memory system 730 can include separate integrated circuits or both the processor 732 and the memory device 734 can be on the same integrated circuit. The processor 732 can be a microprocessor or some other type of controlling circuitry such as an application-specific integrated circuit (ASIC).

For clarity, the electronic memory system 730 has been simplified to focus on features with particular relevance to the present disclosure. The memory device 734 includes an array of non-volatile memory cells 701, which can be floating gate flash memory cells with a NAND architecture. The control gates of each row of memory cells are coupled with a row-select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 7 includes address circuitry 740 to latch address signals provided over I/O connections 762 through I/O circuitry 760. Address signals are received and decoded by a row decoder 744 and a column decoder 746 to access the memory array 701. In light of the present disclosure, it will be appreciated by those skilled in the art that the number of address input connections depends on the density and architecture of the memory array 701 and that the number of addresses increases with both increased numbers of memory cells and increased numbers of memory blocks and arrays.

The array of memory cells 701 includes cells that can utilize operating voltages associated with programming. The memory device 734 reads data in the memory array 701 by sensing voltage and/or current changes in the memory array columns using sense/buffer circuitry that in this embodiment can be read/latch circuitry 750. The read/latch circuitry 750 can be coupled to read and latch a row of data from the memory array 701. I/O circuitry 760 is included for bi-directional data communication over the I/O connections 762 with the processor 732. Write circuitry 755 is included to write data to the memory array 701.

Control circuitry 770 decodes signals provided by control connections 772 from the processor 732. These signals can include chip signals, write enable signals, and address latch signals that are used to control the operations on the memory array 701, including read, write, heal, and erase operations. In various embodiments, the control circuitry 770 is responsible for executing instructions from the processor 732 to perform the operating and programming embodiments of the present disclosure. The control circuitry 770 can be a state machine, a sequencer, or some other type of controller. It will be appreciated by those skilled in the art that additional circuitry and control signals can be provided, and that the memory device detail of FIG. 7 has been reduced to facilitate ease of illustration.

Figure 8:
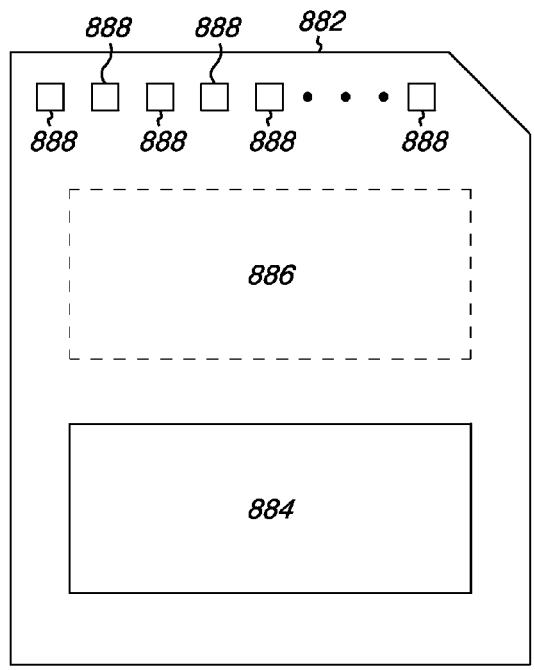
FIG. 8 is a functional block diagram of a memory module having at least one memory device in accordance with one or more embodiments of the present disclosure.

FIG. 8 illustrates memory module 880 as a memory card, although the concepts discussed with reference to memory module 880 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 880 will include a housing 882 (as depicted) to enclose one or more memory devices 884, though such a housing is not essential to all devices or device applications. At least one memory device 884 includes an array of memory cells including at least two adjacent memory cells associated with semiconductor substrate pillars having different heights according to one or more embodiments of the present invention. Where present, the housing 882 includes one or more contacts 888 for communication with a host device. Examples of host devices include digital cameras, digital recording and playback devices, PDAs, personal computers, memory card readers, interface hubs and the like. For some embodiments, the contacts 888 are in the form of a standardized interface. For example, with a USB flash drive, the contacts 888 might be in the form of a USB Type-A male connector. For some embodiments, the contacts 888 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 888 provide an interface for passing control, address and/or data signals between the memory module 880 and a host having compatible receptors for the contacts 888.

The memory module 880 may optionally include additional circuitry 886, which may be one or more integrated circuits and/or discrete components. For some embodiments, the additional circuitry 886 may include a memory controller for controlling access across multiple memory devices 884 and/or for providing a translation layer between an external host and a memory device 884. For example, there may not be a one-to-one correspondence between the number of contacts 888 and a number of connections to the one or more memory devices 884. Thus, a memory controller could selectively couple an I/O connection (not shown in FIG. 8) of a memory device 884 to receive the appropriate signal at the appropriate I/O connection at the appropriate time or to provide the appropriate signal at the appropriate contact 888 at the appropriate time. Similarly, the communication protocol between a host and the memory module 880 may be different than what is required for access of a memory device 884. A memory controller could then translate the command sequences received from a host into the appropriate command sequences to achieve the desired access to the memory device 884. Such translation may further include changes in signal voltage levels in addition to command sequences.

The additional circuitry 886 may further include functionality unrelated to control of a memory device 884 such as logic functions as might be performed by an ASIC. Also, the additional circuitry 886 may include circuitry to restrict read or write access to the memory module 880, such as password protection, biometrics or the like. The additional circuitry 886 may include circuitry to indicate a status of the memory module 880. For example, the additional circuitry 886 may include functionality to determine whether power is being supplied to the memory module 880 and whether the memory module 880 is currently being accessed, and to display an indication of its status, such as a solid light while powered and a flashing light while being accessed. The additional circuitry 886 may further include passive devices, such as decoupling capacitors to help regulate power requirements within the memory module 880.

CONCLUSION

Methods, arrays, devices, modules, and systems for memory cell heights have been shown. One array of memory cells includes a number of semiconductor substrate pillars having a first gate separated from the pillars by a first dielectric. A second gate is separated from the first gate by a second dielectric. At least two adjacent semiconductor substrate pillars in the array have different heights.

Although specific embodiments have been illustrated and described herein, those ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An array of memory cells, comprising:
a number of semiconductor substrate pillars;
a number of charge storage nodes, wherein each of the charge storage nodes is fabricated or a respective one of the number of pillars and separated from the respective semiconductor substrate pillar by a dielectric;
a number of conductively coupled gates, wherein each of the number of gates is associated with a respective one of the number of storage nodes; and
wherein at least two of the semiconductor substrate pillars have different heights with charge storage nodes fabricated thereon to a substantially equivalent elevation.

2. The array of claim 1, wherein the memory cells are non-volatile floating gate memory cells and the gates comprise and are conductively coupled by a select line and columns coupled to sense lines, and wherein cells along a given select line are formed on pillars fabricated to at least two different heights.

3. The array of claim 2, wherein a first group of pillars associated with the select line are fabricated to a first height and a second group of pillars associated with the select line are fabricated to a second height, wherein the second height is greater than the first height by a distance at least as great as a thickness of the dielectric.

4. The array of claim 2, wherein cells along the given select line alternate between cells having a pillar fabricated to a first height and cells having a pillar fabricated to a second height.

5. The array of claim 1, wherein the array is a NAND array having rows of cells coupled to select lines and columns coupled to sense lines, wherein at least two adjacent columns of cells arc formed on pillars fabricated to different heights.

6. An array of non-volatile memory cells, comprising:
an array of semiconductor substrate pillars, each pillar associated with a particular memory cell, the array formed in rows coupled to select lines and columns coupled to sense lines;
a floating gate for each cell separated from respective semiconductor substrate pillars by a first dielectric;
a control gate for each cell separated from respective first gates by a second dielectric; and
wherein at least two adjacent semiconductor substrate pillars have different heights with the floating gates being fabricated thereon to a substantially equivalent elevation.

7. The array of claim 6, wherein adjacent cells along a given select line are formed on pillars having alternating heights.

8. The array of claim 7, wherein the alternating heights have a height difference of at least two hundred Angstroms (200 Å).

9. The array of claim 6, wherein a first group of cells along a given select line are formed on pillars having a first height and a second group of cells along the given select line arc formed on pillars having a second height, the second height being different from the first height.

10. The array of claim 9, wherein the first group of cells includes at least two adjacent cells along the given select line and the second group of cells includes at least two adjacent cells along the given select line.

11. An array of memory cells, comprising:
an array of semiconductor substrate pillars, each semiconductor substrate pillar associated with a particular memory cell, the array funned in rows coupled to select lines and columns coupled to sense lines;
a floating gate for each cell separated from respective semiconductor substrate pillars by a first dielectric;
a control gate tar each cell separated from respective first gates by a second dielectric; and
wherein a first group of memory cells are formed oil semiconductor substrate pillars having a first height and an adjacent second group of memory cells are formed on semiconductor substrate pillars having a second height, the second height being different from the first height, and
wherein the floating gates are fabricated to a substantially equivalent elevation.

12. The array of claim 11, wherein the first group includes at least a pair of adjacent memory cells along a given select line and the second group includes at least a pair of adjacent memory cells along a given select line.

13. The array of claim 11, wherein a third group of memory cells are formed on semiconductor substrate pillars having a third height different from the first and the second height.

14. The array of claim 11, wherein the first group of memory cells are coupled to sense lines belonging to a first group and the second group of memory cells are coupled to sense lines belonging to a second group.

15. The array of claim 14, wherein the first group of sense lines correspond to a first set of non-adjacent bit lines, and the second group of sense lines correspond to a second set anon-adjacent bit lines, 16. A method of forming an array of memory cells, comprising:
forming an array of semiconductor pillars on a substrate, each pillar associated with a particular memory cell;
forming a first gate for each cell, wherein the first gate is separated from a respective pillar by a first dielectric;
forming a second gate for each cell, wherein the second gate is separated from the first gate by a second dielectric; and
wherein forming the pillars includes forming the pillars such that at least two adjacent pillars have different heights with each of the first gates being fabricated to a substantially equivalent elevation.

17. The method of claim 16, wherein forming the pillars comprises forming the pillars such that adjacent columns of pillars have different heights.

18. The method of claim 16, wherein forming, the pillars comprises forming the pillars such that at least a first pair of adjacent pillars coupled to a given select line are formed to a first height and such that at least a second pair of adjacent pillars coupled to the given select line are formed to a second height different from the first height.

19. The method of claim 16, wherein the method includes:
coupling rows of pillars to select lines;
coupling columns of pillars to sense lines; and forming the pillars comprises
forming the pillars such that at least two adjacent pillars coupled to a given sense line are formed to different heights.

20. The method of claim 16, wherein forcing the pillars such that at least two adjacent pillars have different heights includes:
forming pillars coupled to a first sense line to a first height; and forming pillars coupled to a second sense line to a second height such that the second height has a height which is greater than the first height by at least a thickness of the first dielectric.

21. A method for operating a memory array, comprising:

programming a first group of memory cells associated with semiconductor substrate pillars having a first height with first charge storage nodes fabricated thereon to a substantially equivalent elevation; and programming a second group of memory cells associated with semiconductor substrate pillars having a second height with second charge storage nodes fabricated thereon to the substantially equivalent elevation, wherein the second height is different from the first height.

22. The method of claim 21, wherein for an array of cells arranged in rows coupled to select lines and columns coupled to sense lines, the method includes:

for cells coupled to a given select line, programming the first group of cells in a first order; and programming the second group of cells in a second order.

23. The method. of claim 22, wherein for an array of cells arranged in rows coupled to select lines and columns coupled to sense lines, the method includes:

for cells coupled to a given select line, associating a first group of columns with cells having the first height with a first group of sense lines; and associating a second group of columns with cells having the second height with a second group of sense lines.

24. The method of claim 23, wherein associating the first and the second group of columns includes associating non-adjacent sense lines.

25. The method of claim 24, wherein the method includes using control circuitry to map the first group of non-adjacent sense lines to adjacent columns having the first group of cells and using control circuitry to map the second group of non-adjacent sense lines to adjacent columns having the second group of cells.

* * * * *

UNITED STATES PATENT AND TRADEMARK OFFICE
CERTIFICATE OF CORRECTION

PATENT NO.         : 7,898,856 B2
APPLICATION NO.    : 11/924103
DATED              : March 1, 2011
INVENTOR(S)        : Seiichi Aritome It is certified that error appears in the above-identified patent and that said Letters Patent is hereby corrected as shown below:

In column 17, line 12, in Claim 1, delete "or" and insert -- on --, therefor.

In column 17, line 39, in Claim 5, delete "arc" and insert -- are --, therefor.

In column 17, line 61, in Claim 9, delete "arc" and insert -- are --, therefor.

In column 18, line 4, in Claim 11, delete "funned" and insert -- formed --, therefor.

In column 18, line 8, in Claim 11, delete "tar" and insert -- for --, therefor.

In column 18, line 10, in Claim 11, delete "oil" and insert -- on --, therefor.

In column 18, lines 31-32, in Claim 15, delete "anon-adjacent" and insert -- of non-adjacent --, therefor.

In column 18, line 32, in Claim 15, delete "lines," and insert -- lines. --, therefor.

In column 18, line 50, in Claim 18, delete "forming," and insert -- forming --, therefor.

In column 18, line 63, in Claim 20, delete "forcing" and insert -- forming --, therefor.

In column 20, line 2, in Claim 23, delete "method." and insert -- method --, therefor.

Signed and Sealed this
Nineteenth Day of April, 2011

David J. Kappos
*Director of the United States Patent and Trademark Office*